United States Patent [19]
Nakahata et al.

[11] Patent Number: 5,294,858
[45] Date of Patent: Mar. 15, 1994

[54] SURFACE ACOUSTIC WAVE DEVICE

[75] Inventors: Hideaki Nakahata; Akihiro Hachigo; Shinichi Shikata; Naoji Fujimori, all of Hyogo, Japan

[73] Assignee: Sumitomo Electric Industries, Ltd., Osaka, Japan

[21] Appl. No.: 19,136

[22] Filed: Feb. 18, 1993

[30] Foreign Application Priority Data

Feb. 21, 1992 [JP] Japan .................................. 4-034754

[51] Int. Cl.⁵ ...................... H01L 41/04; H01L 41/08; H01L 41/18; H02N 2/00
[52] U.S. Cl. .................................. 310/313 A; 333/150
[58] Field of Search .............. 333/150, 151, 152, 153, 333/154; 310/313 R, 313 A, 313 B, 313 C, 313 D

[56] References Cited

U.S. PATENT DOCUMENTS 4,952,832  8/1990  Imai et al. ...................... 310/313 A
5,160,869  11/1992 Nakahata et al. ............... 310/313 A

FOREIGN PATENT DOCUMENTS 0020714  1/1989  Japan .
3-198412  8/1991  Japan .

Primary Examiner—Robert J. Pascal
Assistant Examiner—Darius Gambino
Attorney, Agent, or Firm—W. G. Fasse

[57] ABSTRACT

Disclosed herein is a surface acoustic wave device employing diamond, which has an operation frequency in a range of several hundred MHz to several GHz, a high propagation velocity and a large electromechanical coefficient. This surface acoustic wave comprises a substrate, a diamond layer which is formed on the substrate, a ZnO layer which is formed on the diamond layer, and interdigital electrodes which are formed on the ZnO layer, and utilizes a second order mode of a surface acoustic wave which is excited in a structure satisfying $(2\pi \cdot H/\lambda) = 0.9$ to $2.3$ where H represents the thickness of the ZnO layer and $\lambda$ represents the wavelength of the surface acoustic wave. This surface acoustic wave device can be used in an extremely high frequency range, whereby the same is applicable to a resonator, a delay line, a signal processing device, a convolver, a correlator or the like in addition to a filter.

4 Claims, 7 Drawing Sheets $\frac{2\pi}{\lambda}HD = 4$ $\frac{2\pi}{\lambda}HD = 3$ $\frac{2\pi}{\lambda}HD = 4$

SURFACE ACOUSTIC WAVE DEVICE

BACKGROUND OF THE INVENTION

1. Field of the Invention

The present invention relates to a surface acoustic wave device, and more particularly, it relates to a surface acoustic wave device which operates in a high frequency range of a GHz band.

2. Description of the Background Art

A surface acoustic wave device utilizing a surface acoustic wave which is propagated with energy concentrated on a surface of a solid body is applied to an intermediate frequency filter of a television receiver or the like due to its compactness and stability in performance.

Such a surface acoustic wave device is formed by a piezoelectric layer and interdigital electrodes. In general, an alternating electric field is applied to the piezoelectric layer through the interdigital electrodes to excite a surface acoustic wave.

The piezoelectric layer is prepared from a material such as a bulk single crystal of $LiNbO_3$ or $LiTaO_3$, or a ZnO thin film which is vapor-deposited on a substrate.

In general, an operation frequency f of such a surface acoustic wave device is determined as $f = v/\lambda$, where v represents the propagation velocity of the surface acoustic wave and $\lambda$ represents the wavelength of the surface acoustic wave device. In order to increase the operation frequency f, therefore, the propagation velocity v may be increased or the wavelength $\lambda$ may be reduced.

The value of the propagation velocity v depends on the materials for the piezoelectric layer and the substrate, as well as the mode of the surface acoustic wave. On the other hand, the wavelength $\lambda$ is determined by the pitch of the interdigital electrodes.

FIG. 1 is a plane view showing exemplary interdigital electrodes of the most standard structure. Referring to FIG. 1, a pair of interdigital electrodes, each having electrode tips of a width d which are integrally formed with each other at intervals of 3×d, are opposed to each other so that the electrode tips of the same polarities are alternately arranged. In the interdigital electrodes of such structure, the wavelength $\lambda$ is equal to 4×d.

FIG. 2 is a plane view showing another exemplary interdigital electrodes. In each of a pair of opposite interdigital electrodes shown in FIG. 2, pairs of electrode tips of a width d, which are spaced apart at an interval of d, are arranged at intervals of 5×d. In the interdigital electrodes of such structure, the wavelength $\lambda$ is equal to 8×d, and it is equal to 8×d/3 for the third resonance wave.

However, the value of the propagation velocity v is limited by the materials for the piezoelectric layer and the substrate, as hereinabove described. Further, the lower limit of the periodic size of the interdigital electrodes deciding the wavelength $\lambda$ is restricted by a limit in the technique of fine processing. Thus, the operation frequency of a currently available surface acoustic wave device is limited to 900 MHz.

On the other hand, a surface acoustic wave device which is applicable to a higher frequency range (GHz band) is required with increase in frequency in the field of communication such as satellite communication or mobile communication.

To this end, development is now being made on employment of a film of diamond which has the maximum sound velocity (transversal wave velocity: 13000 m/s; longitudinal wave velocity: 16000 m/s) among substances or diamond-like carbon, to be stacked on a piezoelectric material for forming a surface acoustic wave device.

In order to implement a surface acoustic wave device having a high operation frequency f, it is generally desirable to attain a large electromechanical coefficient $K^2$ (index of conversion efficiency for converting electric energy to mechanical energy) in addition to the aforementioned high propagation velocity v. This electromechanical coefficient $K^2$ must be greater than or equal to 0.1%, and is preferably greater than or equal to 0.5%, depending on the application.

When a thin piezoelectric film formed on a substrate is employed, the propagation velocity v and the electromechanical coefficient $K^2$ remarkably depend not only on the physical properties of the materials for the piezoelectric film and the substrate, but on the thickness of the piezoelectric thin film.

When the substrate is in the form of a film, i.e., when the piezoelectric thin film is formed on a film-type substrate which is formed on a base material, the propagation velocity v and the electromechanical coefficient $K^2$ also depend on the thickness of the film-type substrate.

In a surface acoustic wave device which is formed by a ZnO layer and a diamond or diamond-like carbon film, however, absolutely no recognition has been made as to the relation between the film thicknesses of the ZnO and diamond films and the propagation velocity and the electromechanical coefficient. Therefore, it has been impossible to properly design a high-efficiency surface acoustic wave device operating in a high frequency range.

As disclosed in Japanese Patent Laying-Open No. 3-198412 (1991), the inventors have implemented surface acoustic wave devices having high surface acoustic wave propagation velocities and large electromechanical coefficients by defining film thickness ranges of ZnO layers in relation to wavelengths while specifying modes of surface acoustic waves as to four types of devices shown in FIGS. 3 to 6.

When a surface acoustic wave device is formed by a piezoelectric thin film which is grown on a substrate having a higher sound velocity than the piezoelectric material, a plurality of surface acoustic waves having different propagation velocities v are generally excited in a zeroth order mode, a first order mode, a second order mode, ... successively from the smaller velocity side.

The inventors have disclosed surface acoustic wave devices particularly utilizing zeroth, first and third order modes in detail in the aforementioned gazette. However, no sufficient disclosure has been made as to a surface acoustic wave device utilizing a second order mode.

SUMMARY OF THE INVENTION

An object of the present invention is to provide a high-efficiency surface acoustic wave device employing diamond, which has an operation frequency in a range of several hundred MHz to several GHz and is capable of selectively utilizing a high operation frequency in particular.

Provided according to the present invention is a surface acoustic wave device comprising a substrate, a diamond layer which is formed on the substrate, a ZnO layer which is formed on the diamond layer, and interdigital electrodes which are formed on the ZnO layer. This surface acoustic wave device utilizes a second order mode of a surface acoustic wave which is excited in a structure satisfying $(2\pi \cdot H/\lambda) = 0.9$ to 2.3, where H represents the thickness of the ZnO layer and $\lambda$ represents the wavelength of the surface acoustic wave.

The diamond layer may be replaced by a diamond-like carbon layer.

Further, interfacial short-circuiting electrodes may be provided on the diamond or diamond-like carbon layer.

FIG. 3 is a sectional view showing an example of the inventive surface acoustic wave device. Referring to FIG. 3, this surface acoustic wave device comprises a substrate 1, a diamond or diamond-like carbon layer 2 which is formed on the substrate 1, a ZnO layer 3 which is formed on the diamond or diamond-like carbon layer 2 and interdigital electrodes 4 which are formed on the ZnO layer 3.

FIG. 4 is a sectional view showing another example of the inventive surface acoustic wave device. Referring to FIG. 4, interfacial short-circuiting electrodes 5 are formed on the diamond or diamond-like carbon layer 2 of the surface acoustic wave device shown in FIG. 3.

In the surface acoustic wave device having the structure shown in FIG. 3 or 4, the as-formed interdigital electrodes 4 are not subjected to damages such as deformation after the steps of forming the device since the fine interdigital electrodes 4 are formed by photolithography or the like in the final step.

On the other hand, FIGS. 5 and 6 illustrate other possible structures of surface acoustic wave devices. In such surface acoustic wave devices, however, the as-formed interdigital electrodes 4 may be subjected to damages such as deformation since ZnO layers 3 and the like are formed after formation of the interdigital electrodes 4.

Thus, the inventive surface acoustic wave devices shown in FIGS. 3 and 4 are superior in working to those shown in FIGS. 5 and 6.

Throughout the specification, symbol H represents the film thickness of the ZnO layer, and this film thickness is expressed as $(2\pi \cdot H/\lambda)$, where $\lambda$ represents the wavelength of the surface acoustic wave which is propagated on this layer. Similarly, symbol HD represents the film thickness of the diamond layer, and this film thickness is expressed as $(2\pi \cdot HD/\lambda)$, where $\lambda$ represents the wavelength. These are dimensionless parameters. According to an experiment made by the inventors, it has been recognized that the propagation velocity v and the electromechanical coefficient $K^2$ are influenced by ratios of the film thicknesses H and HD to the wavelength $\lambda$ rather than absolute values thereof.

FIG. 7 is a graph showing values of the propagation velocity v of a second order mode surface acoustic wave measured with changes of the film thickness H of a ZnO layer provided on a diamond or diamond-like carbon layer having a film thickness $(2\pi \cdot HD/\lambda) = 4$ in a surface acoustic wave device having the structure shown in FIG. 3 or 4. The axis of abscissas shows the film thickness $(2\pi \cdot H/\lambda)$ of the ZnO layer, and the axis of ordinates shows the propagation velocity v (m/s). In the range shown in FIG. 7, the propagation velocity v is increased as the film thickness $(2\pi \cdot H/\lambda)$ of the ZnO layer is reduced.

FIG. 8 is a graph showing values of the propagation velocity v of a second order mode surface acoustic wave measured with changes of the film thickness HD of a diamond or diamond-like carbon layer provided under a ZnO layer having a film thickness $(2\pi \cdot H/\lambda) = 2$ in a surface acoustic wave device having the structure shown in FIG. 3 or 4. The axis of abscissas shows the film thickness $(2\pi \cdot HD/\lambda)$ of the diamond or diamond-like carbon layer, and the axis of ordinates shows the propagation velocity v (m/s). Referring to FIG. 8, the propagation velocity v is increased as the film thickness $(2\pi \cdot HD/\lambda)$ of the diamond or diamond-like carbon layer is increased, and the film thickness $(2\pi \cdot HD/\lambda)$ is preferably greater than or equal to 4.

FIGS. 9 to 11 are graphs showing values of the electromechanical coefficient $K^2$ of a second order mode surface acoustic wave measured with changes of the film thickness H of the ZnO layer as to the surface acoustic wave device shown in FIG. 3, with the film thickness HD of the diamond or diamond-like carbon layer serving as a parameter. In each of these figures, the axis of abscissas shows the film thickness $(2\pi \cdot H/\lambda)$ of the ZnO layer, and the axis of ordinates shows the electromechanical coefficient $K^2$ (%).

FIGS. 12 to 14 are graphs showing values of the electromechanical coefficient $K^2$ of a second order mode surface acoustic wave measured with changes of the film thickness H of the ZnO layer as to the surface acoustic wave device shown in FIG. 4, with the film thickness HD of the diamond or diamond-like carbon layer serving as a parameter. In each of these figures, the axis of abscissas shows the film thickness $(2\pi \cdot H/\lambda)$ of the ZnO layer, and the axis of ordinates shows the electromechanical coefficient $K^2$ (%).

Referring to FIGS. 9 to 14, a large second order mode electromechanical coefficient $K^2$ is obtained when the film thickness $(2\pi \cdot H/\lambda)$ of the ZnO layer is in a range of 0.9 to 2.3 in the surface acoustic wave device of either structure.

According to the present invention, therefore, it is possible to provide a surface acoustic wave device having a high propagation velocity v and a large electromechanical coefficient $K^2$, which can be employed in an extremely high frequency range.

Such a surface acoustic wave device is applicable to a resonator, a delay line, a signal processing device, a convolver, a correlator or the like, in addition to a filter.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The diamond films were formed on polycrystalline Si substrates of 12 mm square by microwave plasma CVD, with a raw material gas of $CH_4/H_2=1/100$, microwave power of 400 W and a reaction pressure of 50 Torr. The surfaces of the as-formed films were ground to obtain diamond films of various thicknesses. Then ZnO thin films were formed by RF magnetron sputtering with a sputtering gas of $Ar/O_2=1/1$, RF power of 150 W and a pressure of 0.01 Torr. The sputtering time was so changed as to vary the thicknesses of the ZnO films.

These ZnO films exhibited excellent c-axis orientation properties with o values of 1.8 to 2.1 in X-ray rocking curves. Al was vacuum-deposited on the surface of each ZnO thin film in a thickness of 50 nm by resistance heating, to form 25 pairs of interdigital electrodes having electrode widths and electrode spacings of 2 $\mu$m by photolithography. These electrodes were prepared by wet etching.

Figure 1:
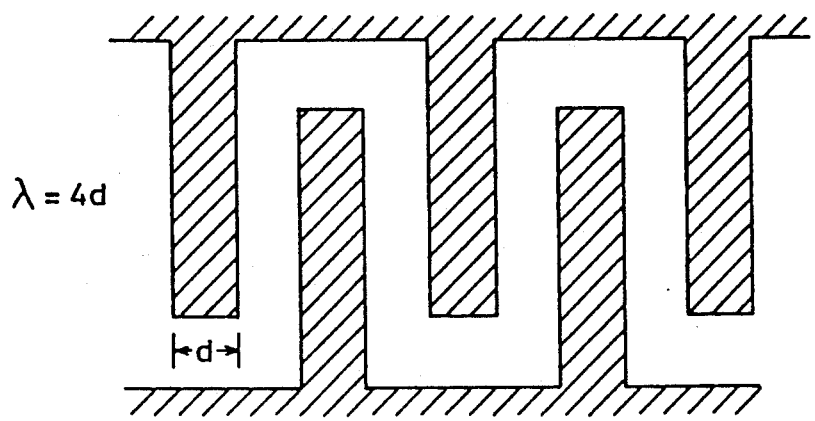
FIG. 1 is a plane view showing exemplary interdigital electrodes.
Figure 2:
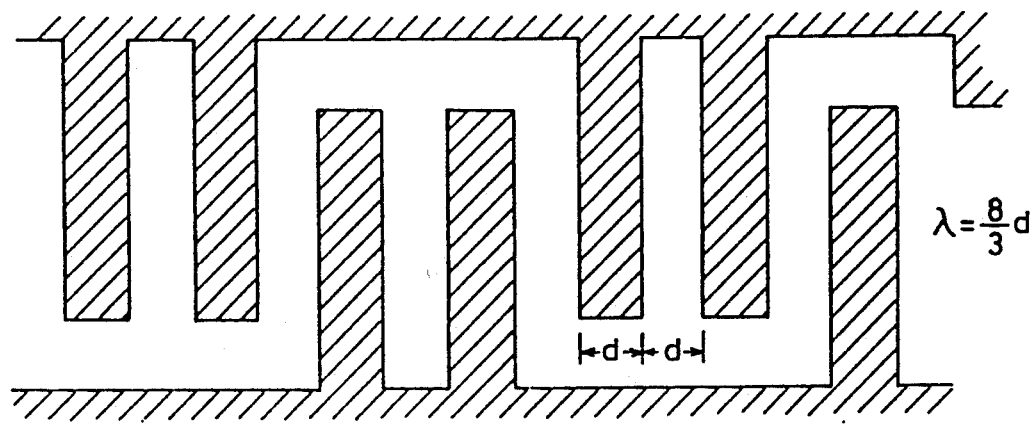
FIG. 2 is a plane view showing another exemplary interdigital electrodes.
Figure 3:
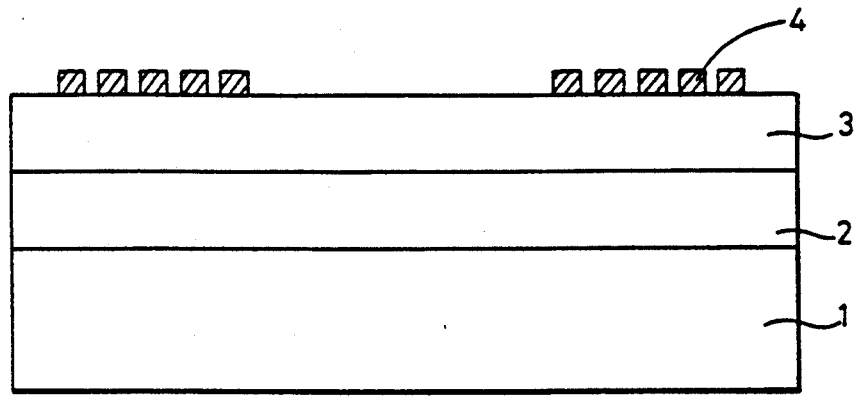
FIG. 3 is a sectional view showing an example of a surface acoustic wave device according to the present invention.
Figure 4:
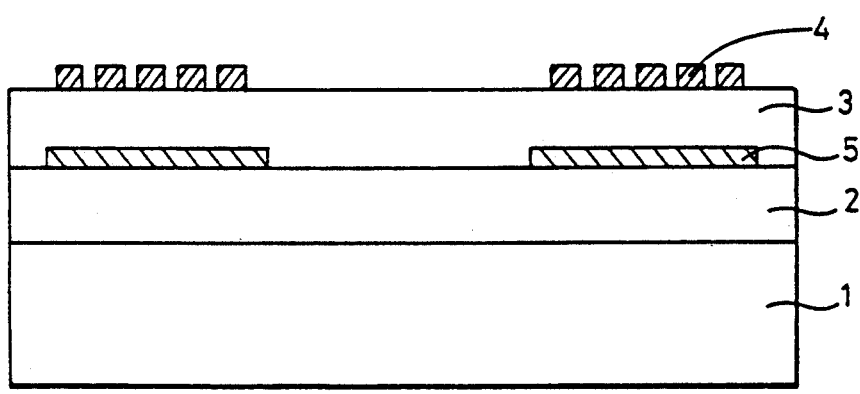
FIG. 4 is a sectional view showing another example of a surface acoustic wave device according to the present invention.
Figure 5:
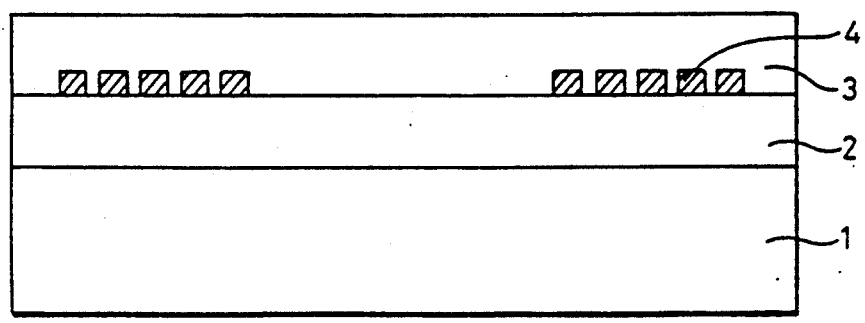
FIG. 5 is a sectional view showing an example of a comparative surface acoustic wave device.
Figure 6:
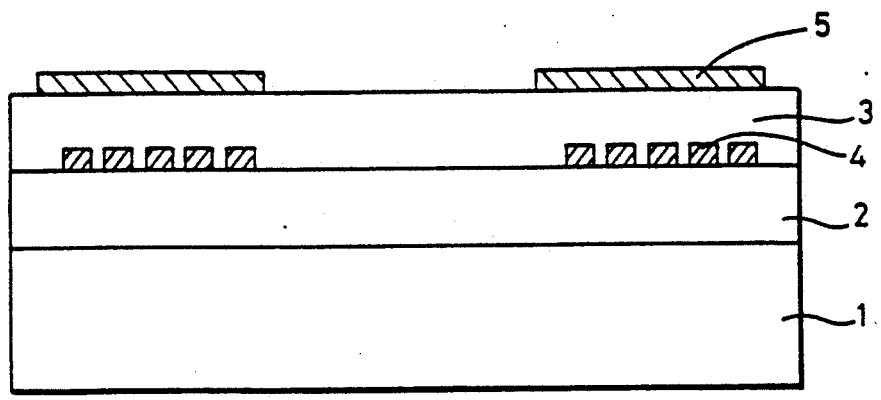
FIG. 6 is a sectional view showing another example of a comparative surface acoustic wave device.
Figure 7:
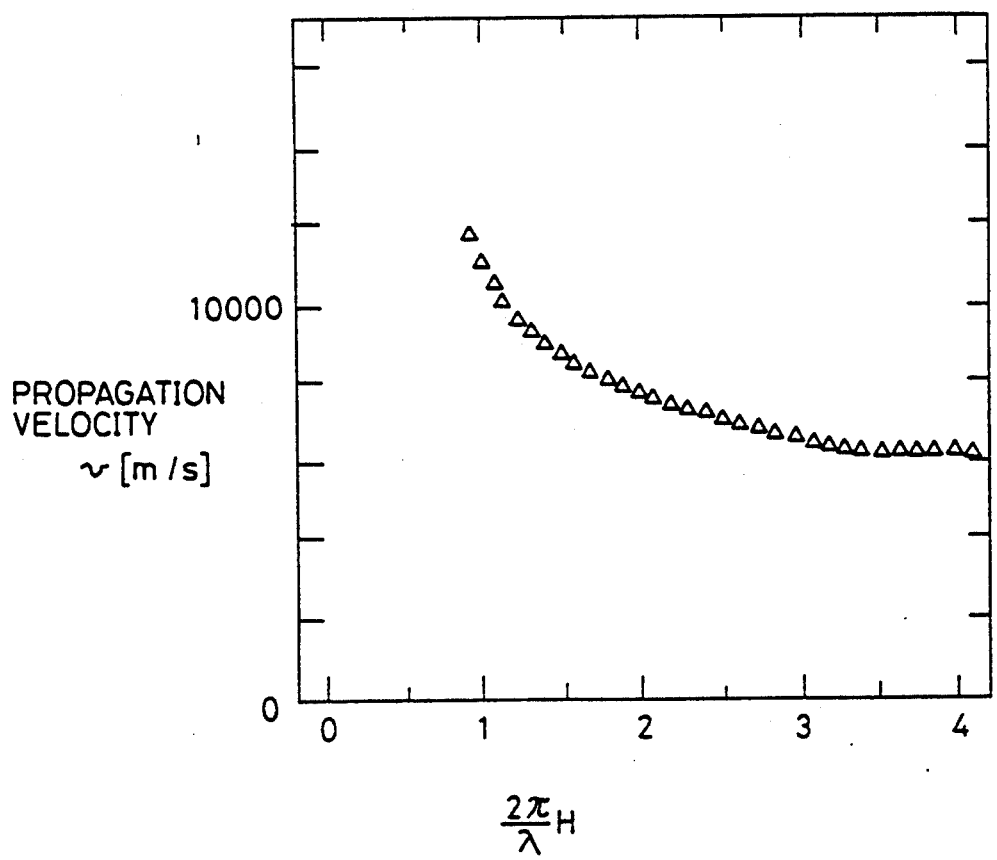
FIG. 7 is a graph showing the relation between the film thickness of a ZnO layer and the propagation velocity v of a second order mode surface acoustic wave measured in a surface acoustic wave device according to the present invention on the assumption that a film thickness HD of a diamond layer is $(2\pi.HD/\lambda)=4$.
Figure 8:
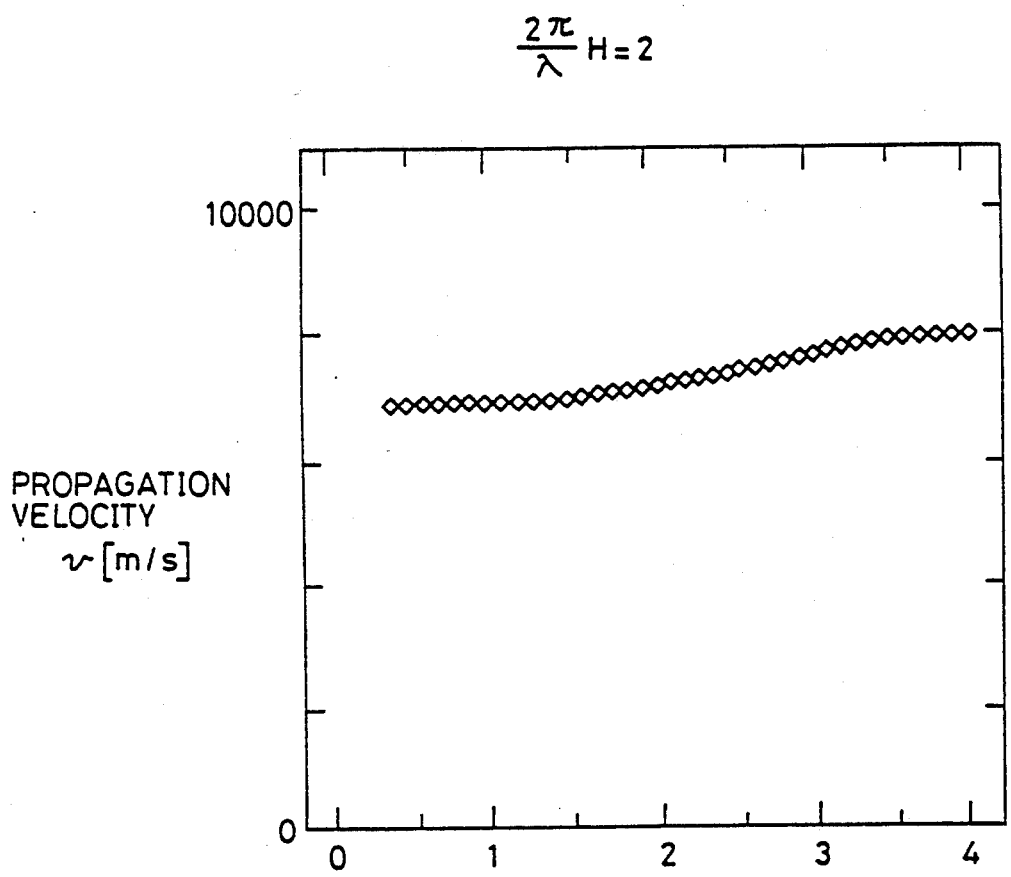
FIG. 8 is a graph showing the relation between the film thickness of the diamond layer and the propagation velocity v of a second order mode surface acoustic wave measured in the surface acoustic wave device according to the present invention on the assumption that the film thickness H of the ZnO layer is $(2\pi.H/\lambda)=1$.
Figure 9:
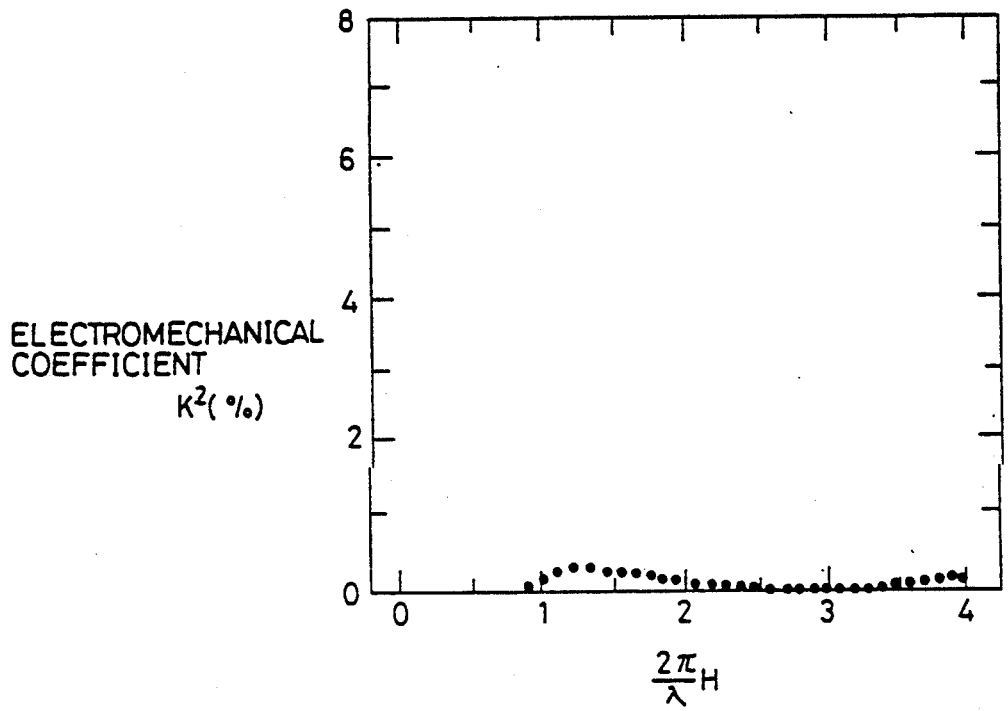
FIG. 9 is a graph showing the relation between the film thickness of the ZnO layer and an electromechanical coefficient $K^2$ of a second order mode surface acoustic wave measured in the inventive surface acoustic device shown in FIG. 3 on the assumption that the film thickness HD of the diamond layer is $(2\pi.HD/\lambda)=2.0$.
Figure 10:
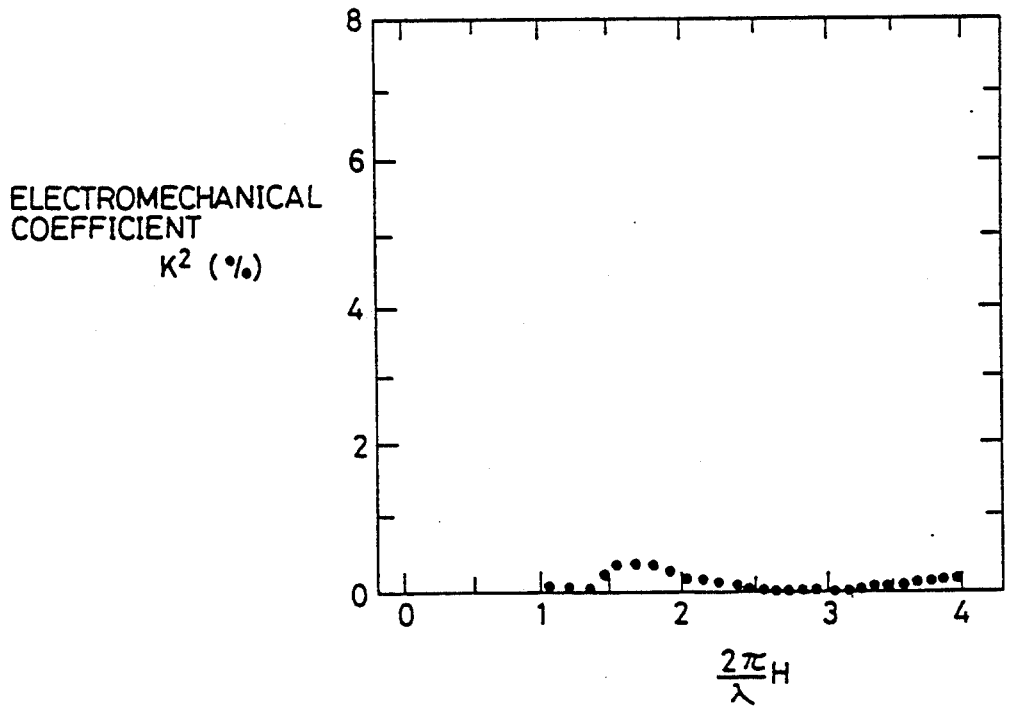
FIG. 10 is a graph showing the relation between the film thickness of the ZnO layer and an electromechanical coefficient $K^2$ of a second order mode surface acoustic wave measured in the inventive surface acoustic device shown in FIG. 3 on the assumption that the film thickness HD of the diamond layer is $(2\pi.HD/\lambda)=3.0$.
Figure 11:
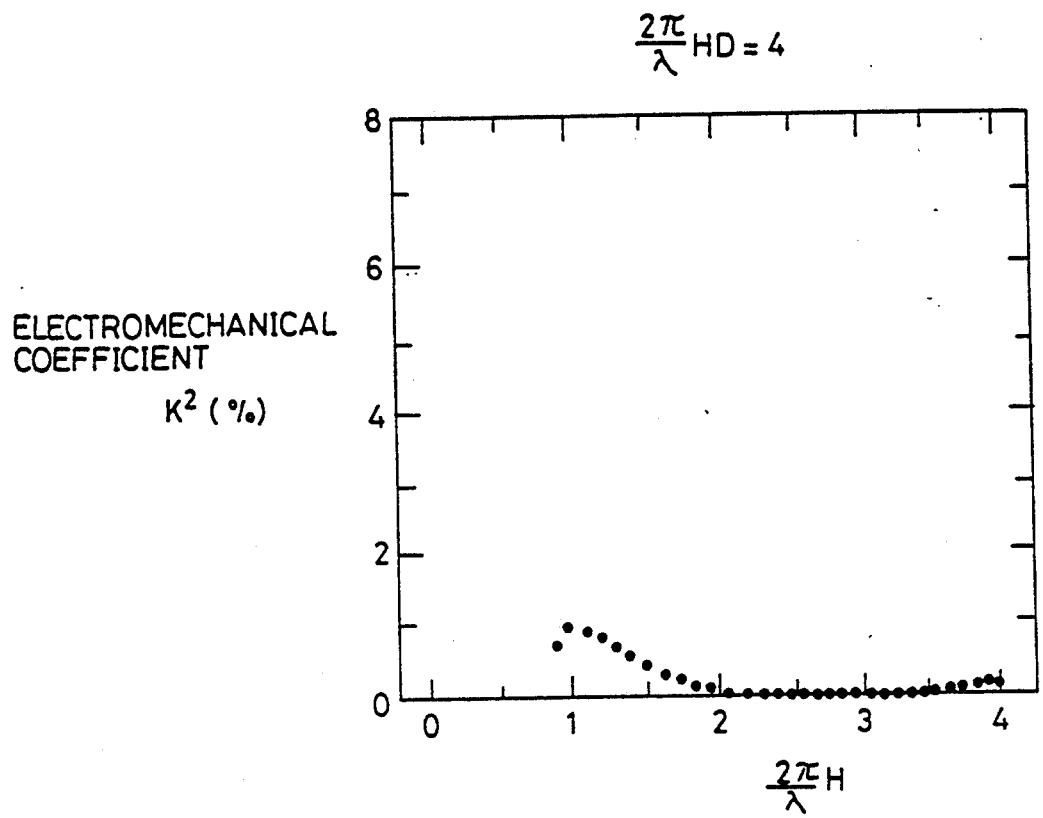
FIG. 11 is a graph showing the relation between the film thickness of the ZnO layer and an electromechanical coefficient $K^2$ of a second order mode surface acoustic wave measured in the inventive surface acoustic device shown in FIG. 3 on the assumption that the film thickness HD of the diamond layer is $(2\pi.HD/\lambda)=4.0$.
Figure 12:
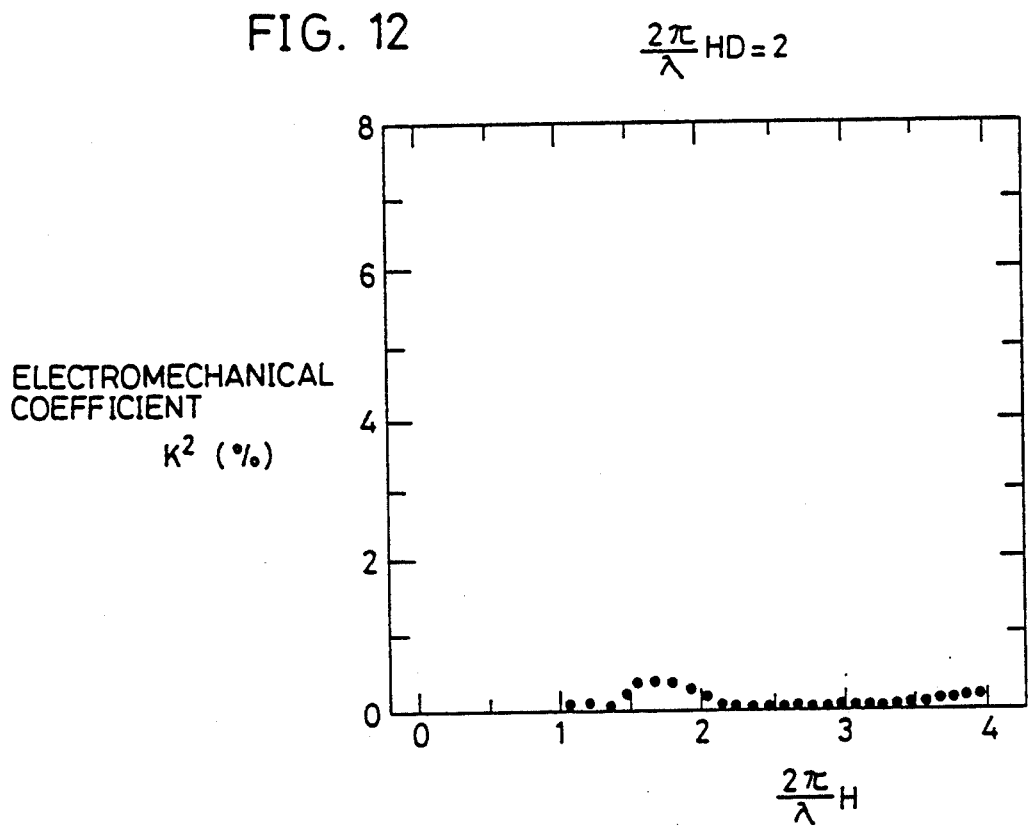
FIG. 12 is a graph showing the relation between the film thickness of the ZnO layer and an electromechanical coefficient $K^2$ of a second order mode surface acoustic wave measured in the inventive surface acoustic device shown in FIG. 4 on the assumption that the film thickness HD of the diamond layer is $(2\pi.HD/\lambda)=2.0$.
Figure 13:
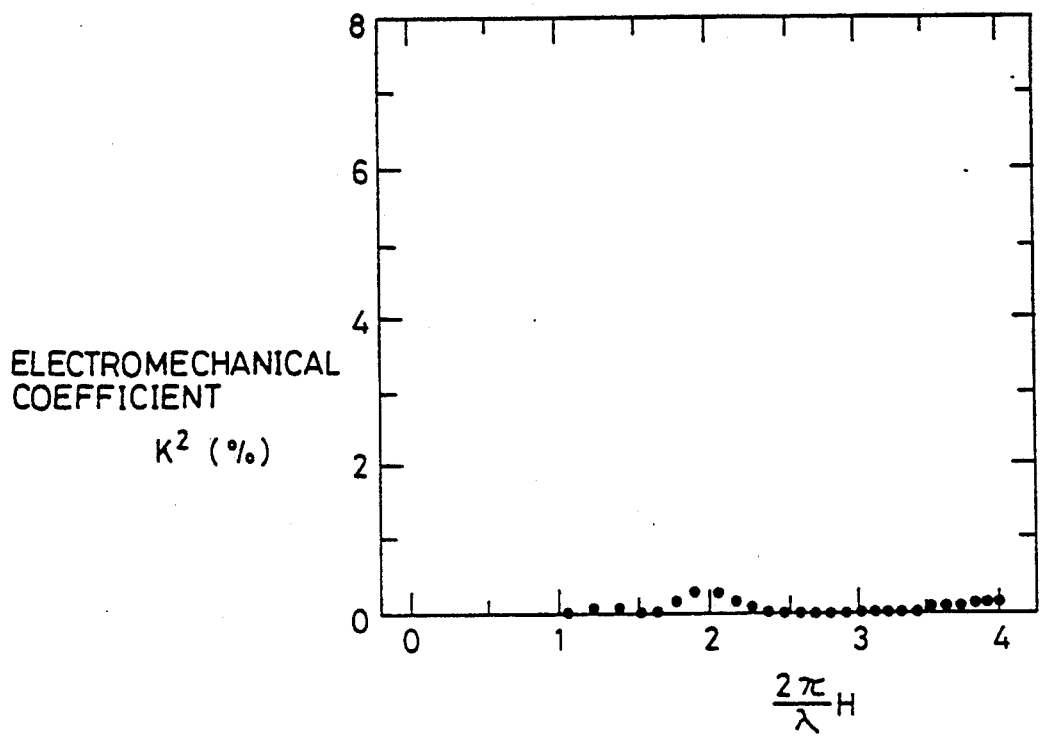
FIG. 13 is a graph showing the relation between the film thickness of the ZnO layer and an electromechanical coefficient $K^2$ of a second order mode surface acoustic wave measured in the inventive surface acoustic device shown in FIG. 4 on the assumption that the film thickness HD of the diamond layer is $(2\pi.HD/\lambda)=3.0$.
Figure 14:
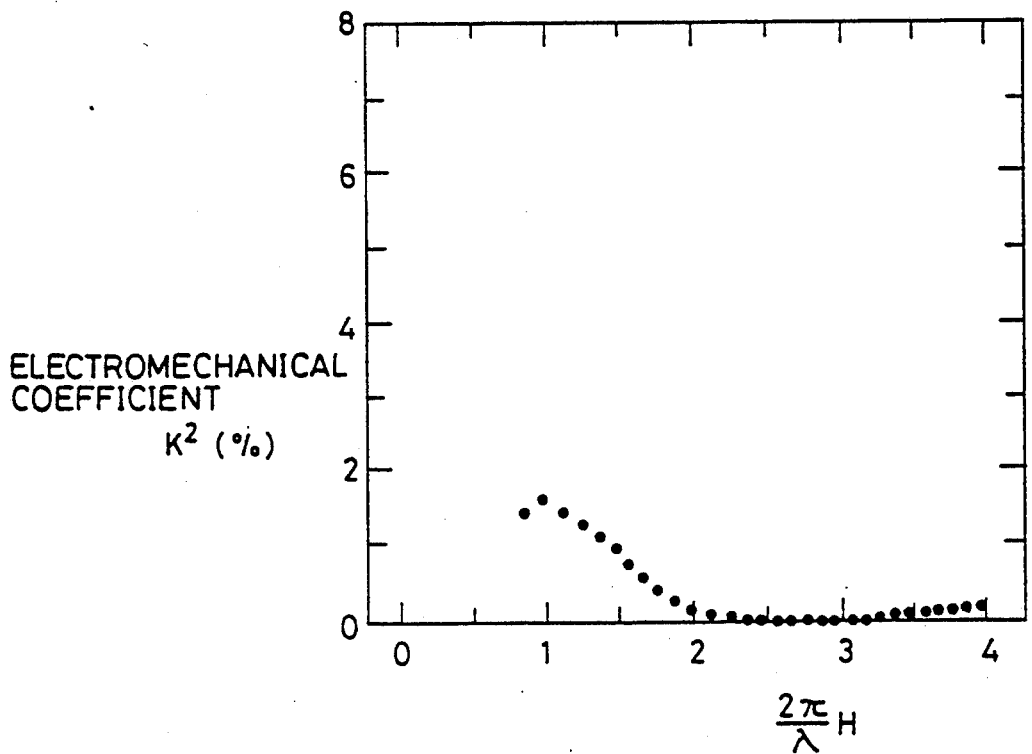
FIG. 14 is a graph showing the relation between the film thickness of the ZnO layer and an electromechanical coefficient $K^2$ of a second order mode surface acoustic wave measured in the inventive surface acoustic device shown in FIG. 4 on the assumption that the film thickness HD of the diamond layer is $(2\pi.HD/\lambda)=4.0$.

The as-obtained surface acoustic wave devices were subjected to measurement of propagation velocities v and electromechanical coefficients $K^2$ of second order mode surface acoustic waves. The results are shown in FIGS. 9 to 11, as hereinabove described.

According to the present invention, the material for the interdigital electrodes and the interfacial short-circuiting electrodes can be prepared from a metal material of small resistivity capable of forming electrodes by etching such as a metal which can be vapor-deposited at a low temperature such as Au, Al or Cu, or a metal which can form a film at a high temperature such as Ti, Mo or W, or composite of two or more metals such as composite of Ti and Al vapor-deposited thereon. In consideration of easiness in formation of electrodes, Al is particularly preferably employed as such material.

The electrodes made of a metal having a low melting point such as Al, for example, can be etched by wet etching with an alkaline solution such as a solution of sodium hydroxide. It is also possible to prepare the electrodes by reactive ion etching with a gas such as $BCl_3$.

The diamond layer may be made of natural diamond, single-crystalline diamond synthesized under an extra-high pressure, or film-type diamond synthesized by vapor deposition. The substrate to be provided with the diamond layer may be prepared from an inorganic material such as Mo or W, a metal, glass, a ceramic material, an oxide or a nitride, or a semiconductor such as Si. The optimum film thickness $(2\pi.H/\lambda)$ of the ZnO layer remains unchanged whatever substrate material is employed. If the diamond layer has an extremely small film thickness HD which is remarkably smaller than the wavelength of the surface acoustic wave, however, this optimum film thickness of the ZnO layer is influenced by the substrate material particularly when the film thickness $(2\pi.H/\lambda)$ is less than or equal to 0.5.

The diamond or diamond-like carbon film can be synthesized by a well-known method of heating an electron emissive material and activating a raw material gas such as hydrocarbon, decomposing/exciting the gas with plasma, decomposing/exciting the gas with light, growing the film by ion bombardment, burning the gas, or the like. The raw material gas can be prepared from a compound containing hydrogen atoms. Alternatively, a gas capable of supplying halogen atoms may be combined with a compound containing hydrogen atoms.

Gases capable of supplying halogen atoms include all compounds containing halogen molecules and halogen atoms in the molecules, such as halogenated organic compounds and halogenated inorganic compounds. Examples of such compounds are paraffin organic compounds such as methane fluoride, ethane fluoride, methane trifluoride, ethylene fluoride and the like, olefin, alicyclic and aromatic organic compounds, and inorganic compounds such as silane halide.

It is possible to reduce the substrate temperature by introducing halogen gas into a film forming chamber, so that the diamond film can be formed at a temperature of 200° to 900° C. The halogen gas preferably has high bonding strength with hydrogen atoms and a small atomic radius. A fluorine compound is preferably employed in order to form a stable film under a low pressure, in particular.

The compound containing hydrogen atoms may be prepared from aliphatic hydrocarbon such as methane, ethane or propane, aromatic hydrocarbon such as benzene or naphthalene, unsaturated hydrocarbon such as ethylene or propylene, an organic compound having hetero atoms such as ammonia, hydrazine or the like, for example. High-purity diamond serves as an insulator having a low dielectric constant. However, it is possible to form semiconductive diamond by introducing an impurity such as B, Al, P or S, or implementing a lattice defect by ion implantation or electron beam irradiation. A semiconductive diamond single crystal containing B, which is rarely yielded as natural diamond, can be artificially prepared by a superhigh pressure method.

The diamond layer or the diamond-like carbon film preferably has a flat surface, in order to reduce losses such as scattering of the surface acoustic wave. Thus, it may be necessary to grind the surface at need. The diamond layer may also be prepared from a single-crystalline diamond thin film which is formed by epitaxy.

As to the ZnO film, it is possible to grow a film having a large piezoelectricity and an excellent c-axis orientation property by employing vapor deposition such as sputtering or CVD.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave device comprising a substrate, a diamond layer being formed on said substrate, a ZnO layer being formed on said diamond layer and interdigital electrodes being formed on said ZnO layer, said surface acoustic wave device utilizing a second order mode of a surface acoustic wave being excited in a structure satisfying $(2\pi.H/\lambda)=0.9$ to 2.3, where H represents the thickness of said ZnO layer and $\lambda$ represents the wavelength of said surface acoustic wave.

2. A surface acoustic wave device comprising a substrate, a diamond layer being formed on said substrate, interfacial short-circuiting electrodes being formed on said diamond layer, a ZnO layer being formed on said interfacial short-circuiting electrodes and interdigital electrodes being formed on said ZnO layer, said surface acoustic wave device utilizing a second order mode of a surface acoustic wave being excited in a structure satisfying $(2\pi.H/\lambda)=0.9$ to 2.3, where H represents the thickness of said ZnO layer and $\lambda$ represents the wavelength of said surface acoustic wave.

3. A surface acoustic wave device comprising a substrate, a diamond-like carbon layer being formed on said substrate, a ZnO layer being formed on said diamond-like carbon layer and interdigital electrodes being formed on said ZnO layer, said surface acoustic wave device utilizing a second order mode of a surface acoustic wave being excited in a structure satisfying $(2\pi.H/\lambda)=0.9$ to 2.3, where H represents the thickness of said ZnO layer and $\lambda$ represents the wavelength of said surface acoustic wave.

4. A surface acoustic wave device comprising a substrate, a diamond-like carbon layer being formed on said substrate, interfacial short-circuiting electrodes being formed on said diamond-like carbon layer, a ZnO layer being formed on said interfacial short-circuiting electrodes and interdigital electrodes being formed on said ZnO layer, said surface acoustic wave device utilizing a second order mode of a surface acoustic wave being excited in a structure satisfying $(2\pi.H/\lambda)=0.9$ to 2.3, where H represents the thickness of said ZnO layer and $\lambda$ represents the wavelength of said surface acoustic wave.

* * * * *